US010700091B2

(12) United States Patent
Economy et al.

(10) Patent No.: US 10,700,091 B2
(45) Date of Patent: *Jun. 30, 2020

(54) ASSEMBLIES HAVING VERTICALLY-EXTENDING STRUCTURES, AND METHODS OF FORMING ASSEMBLIES HAVING VERTICALLY-EXTENDING CHANNEL MATERIAL PILLARS

(71) Applicant: Micron Technology, Inc., Boise, ID (US)

(72) Inventors: David Ross Economy, Boise, ID (US); John Mark Meldrim, Boise, ID (US); Haoyu Li, Boise, ID (US); Yongjun Jeff Hu, Boise, ID (US); Christopher W. Petz, Boise, ID (US); Daniel Billingsley, Meridian, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/431,527

(22) Filed: Jun. 4, 2019

(65) Prior Publication Data

US 2019/0304996 A1 Oct. 3, 2019

Related U.S. Application Data

(63) Continuation of application No. 15/852,989, filed on Dec. 22, 2017, now Pat. No. 10,355,014.

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/31144* (2013.01); *H01L 21/76831* (2013.01);
(Continued)

(58) Field of Classification Search
CPC ......... H01L 27/11582; H01L 21/31144; H01L 21/76831; H01L 27/11519;
(Continued)

(56) References Cited

U.S. PATENT DOCUMENTS 9,972,641 B1 * 5/2018 Zhang ............... H01L 27/11582
10,032,670 B2 * 7/2018 Roesner ............ H01L 23/49513
(Continued)

*Primary Examiner* — Shahed Ahmed
(74) *Attorney, Agent, or Firm* — Wells St. John P.S.

(57) ABSTRACT

Some embodiments include an assembly which has channel material pillars, and which has memory cells along the channel material pillars. A conductive structure is under the channel material pillars. The conductive structure has doped semiconductor material in direct contact with bottom regions of the channel material pillars. One or more of magnesium, scandium, yttrium and lanthanide elements is along the bottom regions of the channel material pillars. Some embodiments include methods of forming assemblies. A structure is formed, and a mass is formed against an upper surface of the structure. Plugs are formed within openings in the mass. The plugs comprise a second material over a first material. The first material includes one or more of magnesium, scandium, yttrium and lanthanide elements. Openings are formed to terminate on the first material, and are then extended through the first material. Channel material pillars are formed within the openings.

8 Claims, 21 Drawing Sheets

(51) Int. Cl.
    *H01L 27/11519*     (2017.01)
    *H01L 21/311*     (2006.01)
    *H01L 27/11565*     (2017.01)
    *H01L 21/768*     (2006.01)
    *H01L 27/1157*     (2017.01)

(52) U.S. Cl.
    CPC .... *H01L 27/1157* (2013.01); *H01L 27/11519* (2013.01); *H01L 27/11556* (2013.01); *H01L 27/11565* (2013.01); *H01L 21/31105* (2013.01)

(58) Field of Classification Search
    CPC ......... H01L 27/11556; H01L 27/11565; H01L 29/0649; H01L 29/792; H01L 27/1157; H01L 29/408; G11C 16/24
    See application file for complete search history.

(56) References Cited

U.S. PATENT DOCUMENTS

| | | | |
|---|---|---|---|
| 2010/0163959 A1* | 7/2010 | Keller | H01L 27/11521 257/321 |
| 2013/0084441 A1* | 4/2013 | Huang | G02B 6/136 428/212 |
| 2015/0279852 A1* | 10/2015 | Mizutani | H01L 27/11556 257/315 |
| 2016/0155931 A1* | 6/2016 | Lee | H01L 43/08 257/421 |
| 2017/0148811 A1* | 5/2017 | Zhang | H01L 27/11575 |
| 2017/0263409 A1* | 9/2017 | Koch | H01J 9/02 |
| 2018/0108669 A1* | 4/2018 | Zhu | H01L 21/31111 |
| 2018/0130883 A1* | 5/2018 | Hardy | H01L 21/02378 |
| 2018/0366386 A1* | 12/2018 | Petz | H01L 23/291 |

\* cited by examiner

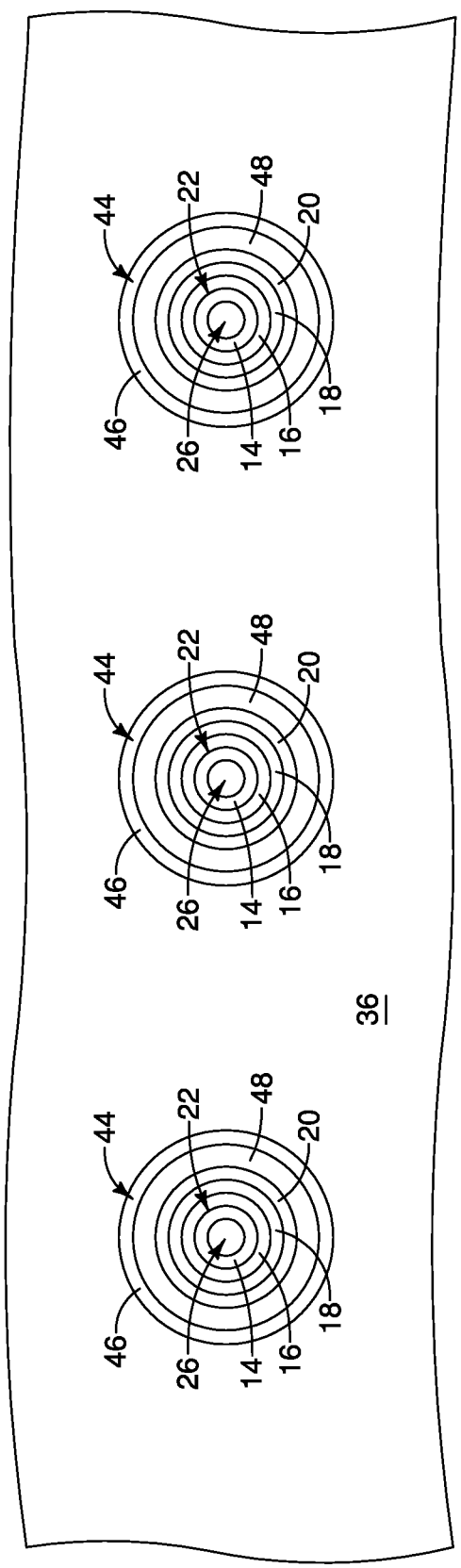

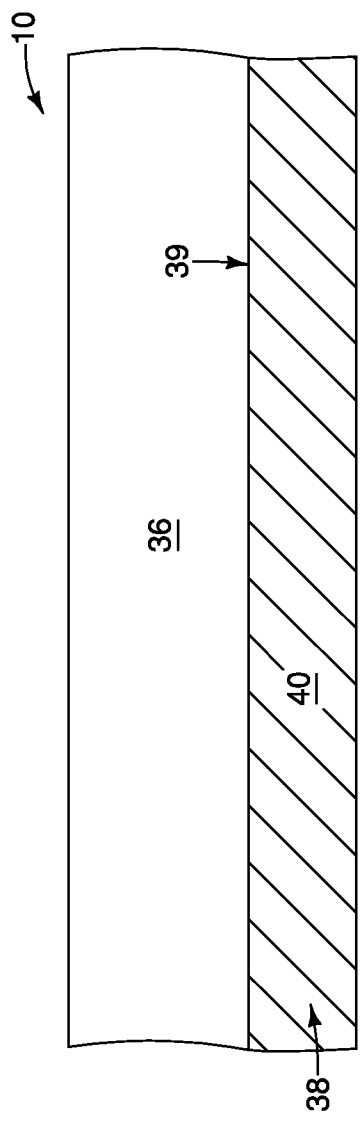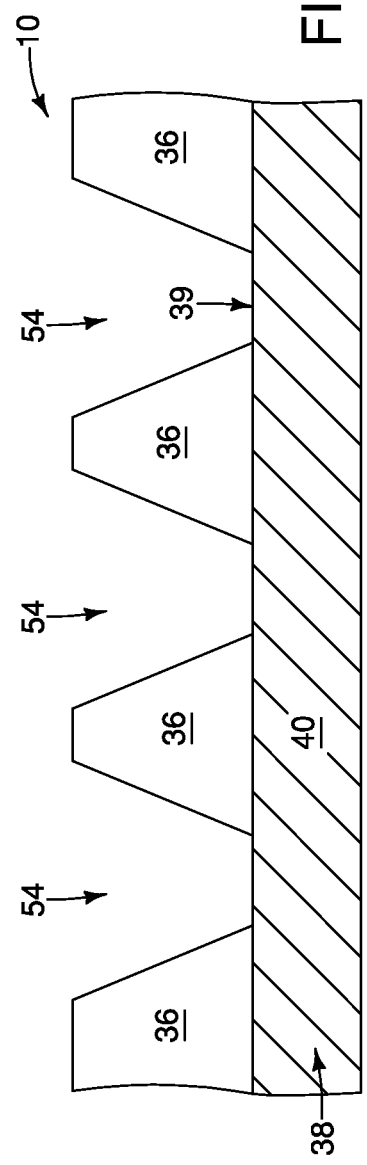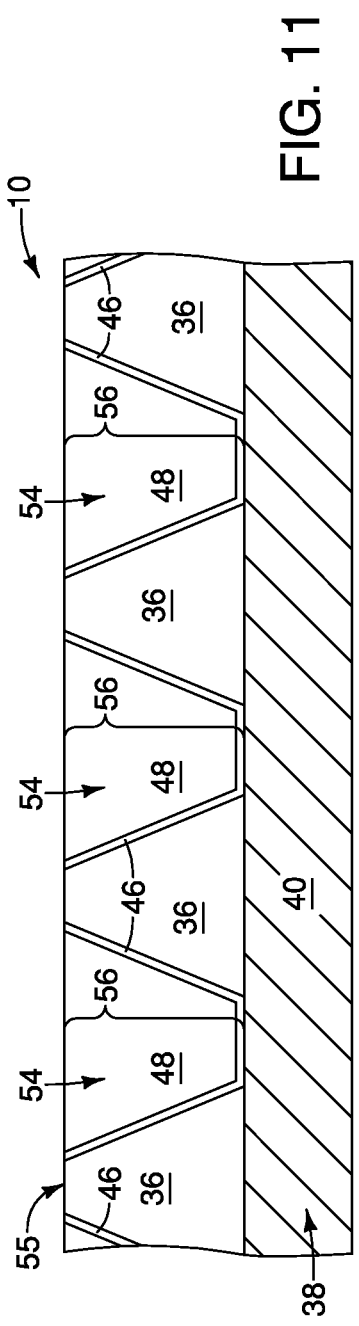

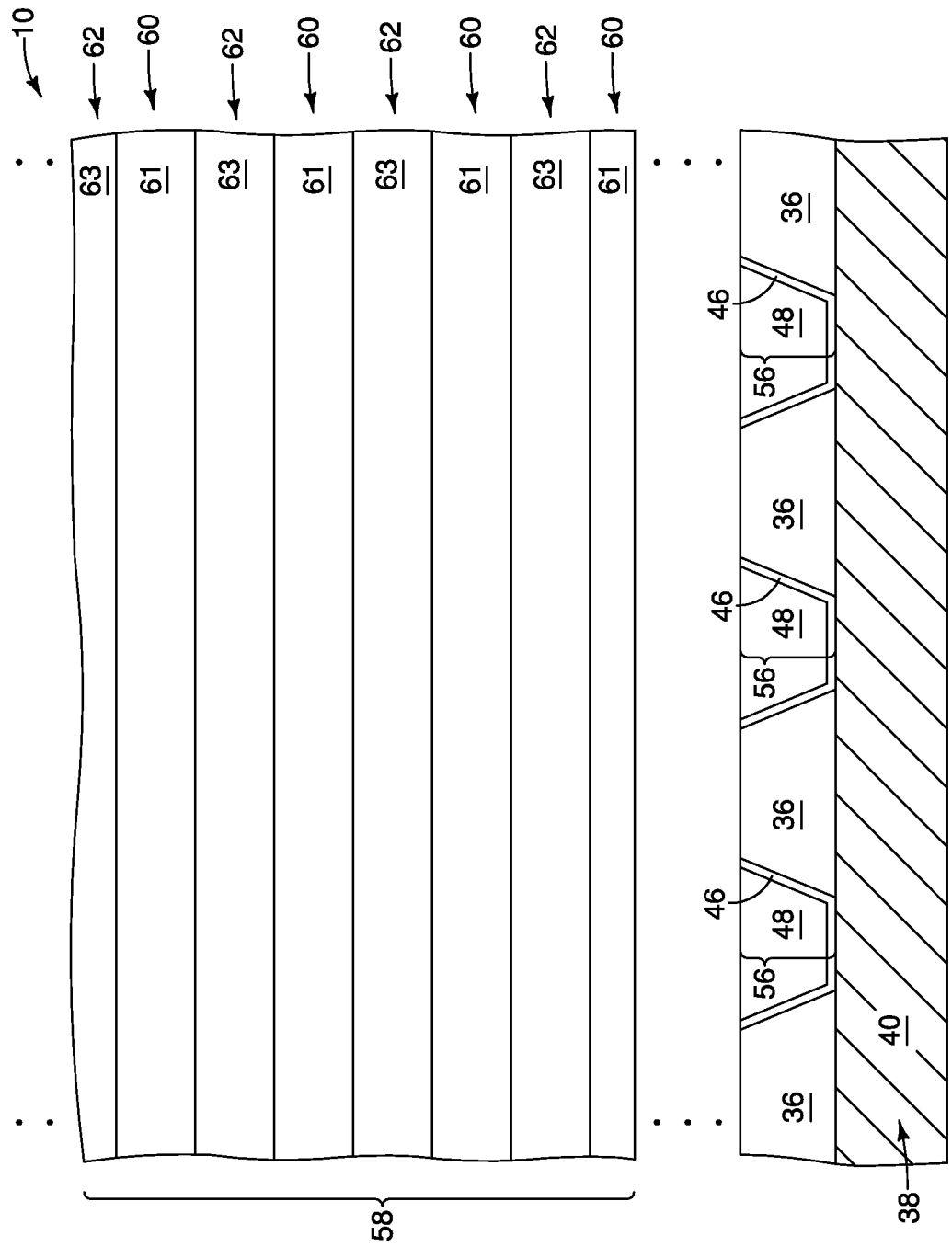

ASSEMBLIES HAVING VERTICALLY-EXTENDING STRUCTURES, AND METHODS OF FORMING ASSEMBLIES HAVING VERTICALLY-EXTENDING CHANNEL MATERIAL PILLARS

RELATED PATENT DATA

This patent resulted from a continuation of U.S. patent application Ser. No. 15/852,989 which was filed Dec. 22, 2017 and which is hereby incorporated by reference herein.

TECHNICAL FIELD

Assemblies having vertically-extending structures, and methods of forming assemblies having vertically-extending channel material pillars. The assemblies may include one or more of magnesium, scandium, yttrium and lanthanide elements along bottom regions of the vertically-extending structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. Memory control unit 118 controls memory operations performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Three-dimensional integrated memory assemblies (e.g., three-dimensional NAND) may have vertical channel pillars extending to horizontal wiring (e.g., source lines). It can be difficult to achieve uniform contact between the channel pillars and the associated horizontal wiring. It would be desirable to develop improved methods for fabricating integrated memory assemblies such that desired contact between the channel material pillars and the horizontal wiring is achieved.

BRIEF DESCRIPTION OF THE DRAWINGS

FIG. 5A is a top-down cross-sectional view along the line A-A of FIG. 5.

FIGS. 9-16 are diagrammatic cross-sectional views of regions of an example construction at example process stages of an example method for fabricating an example memory array.

DETAILED DESCRIPTION OF THE ILLUSTRATED EMBODIMENTS

Some embodiments include methods in which segments of etch-stop material are provided along locations of a conductive structure (e.g., a source line) where electrical contact to channel material pillars is desired. The etch-stop material may comprise one or more of magnesium, scandium, yttrium and lanthanide elements. Openings may be extended through a stack of alternating first and second levels, and to the etch-stop material. Subsequently, the openings may be extended through the etch-stop material to the conductive structure, and then the channel material pillars may be formed within the openings. Memory cells may be formed along the channel material pillars to form a memory array, such as a three-dimensional NAND memory array. In some embodiments, some of the etch-stop material may remain along bottom regions of the channel material pillars in the finished memory array. Example embodiments are described with reference to FIGS. 5-22.

Figure 5:
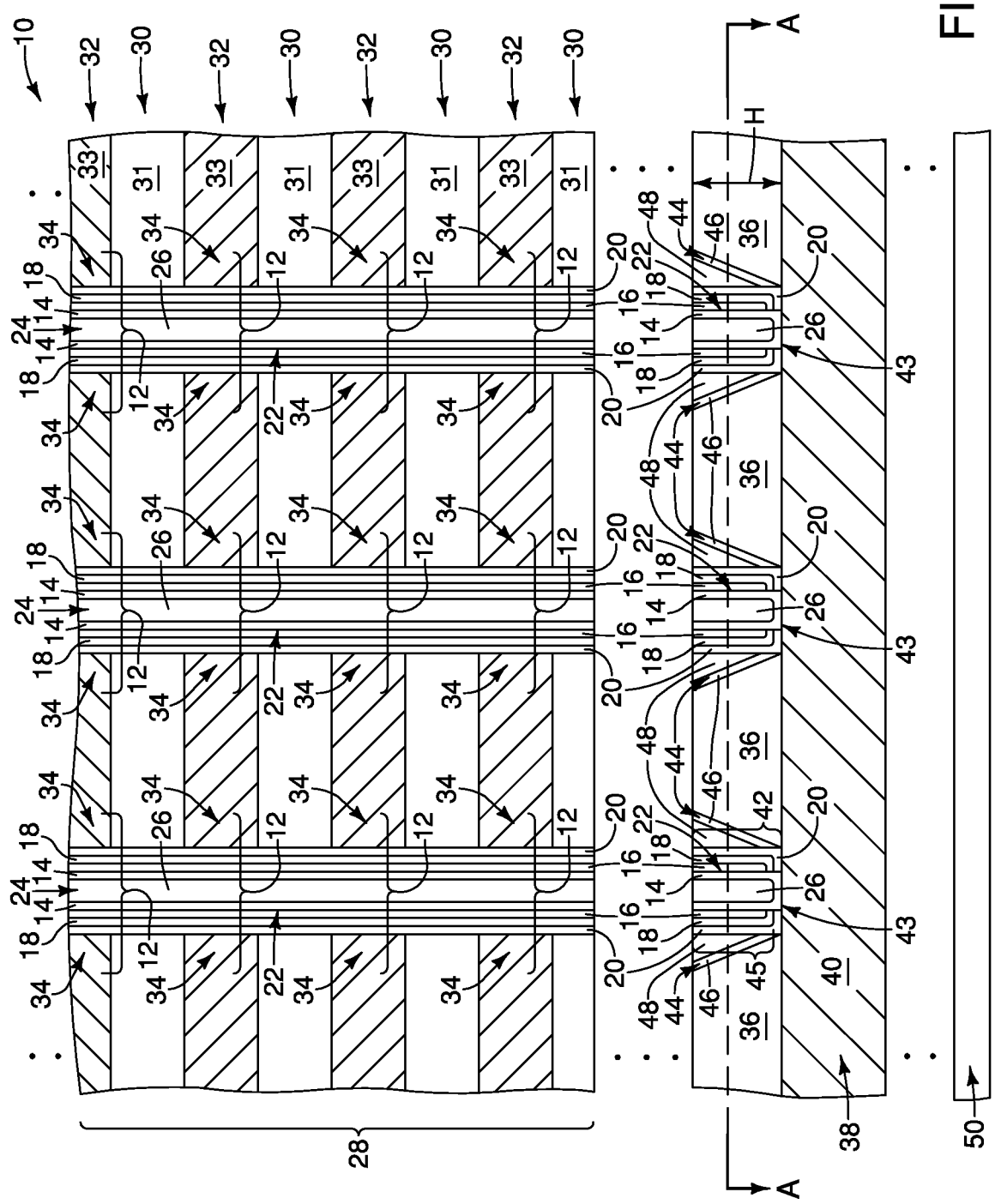
FIGS. 5-8 are diagrammatic cross-sectional views of example assemblies comprising regions of example memory arrays.

Referring to FIG. 5, a region of an assembly 10 is illustrated. The assembly 10 includes a plurality of vertically-stacked memory cells 12. Such memory cells may be NAND memory cells, and may be part of a NAND memory array.

The memory cells include channel material 14, tunneling material 16, charge-storage material 18, and charge-blocking material 20.

The channel material 14 is configured as vertically-extending channel material pillars 22. In the illustrated embodiment, the pillars 22 are "hollow" in that they have voids 24 extending therein. Such voids are filled with insulative material 26. In other embodiments, the pillars 22 may be solid rather than being in the illustrated hollow configuration.

The memory cells 12 may be considered to be arranged along the channel material pillars 22.

The channel material 14 may comprise any suitable composition(s); and in some embodiments may comprise one or more of silicon, germanium, III/V semiconductor materials (e.g., gallium phosphide), semiconductor oxides, etc.

The tunneling material 16 is sometimes referred to as gate dielectric. The tunneling material 16 may comprise any suitable composition(s); and in some embodiments may comprise, for example, one or more of silicon dioxide, aluminum oxide, hafnium oxide, zirconium oxide, etc.

The charge-storage material 18 may comprise any suitable composition(s); and in some embodiments may comprise charge-trapping materials, such as silicon nitride, silicon oxynitride, conductive nanodots, etc. In alternative embodiments (not shown), the charge-storage material 18 may be configured as floating gate material (such as, for example, polycrystalline silicon).

The charge-blocking material 20 may comprise any suitable composition(s); and in some embodiments may comprise one or more of silicon dioxide, aluminum oxide, hafnium oxide, zirconium oxide, etc.

The insulative material 26 may comprise any suitable composition(s); and in some embodiments may comprise silicon dioxide.

The channel material pillars 22 extend through a stack 28 of alternating insulative levels 30 and conductive levels 32.

The conductive levels 32 comprise conductive material 33. Such conductive material may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 30 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor); with an example MONOS being TANOS (tantalum-alumina-nitride-oxide-semiconductor). In some embodiments, the conductive levels 32 may comprise titanium nitride around a metallic core, with the metallic core comprising tungsten or tantalum.

The conductive levels 32 may correspond to wordlines, and may comprise control gates 34 for the memory cells 12. In some embodiments, the vertically-stacked memory cells 12 are configured as NAND strings, with the number of memory cells 12 in the individual strings being determined by the number of conductive levels 32. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The insulative levels 30 comprise insulative material 31. Such insulative material may comprise any suitable composition or combination of compositions; and may, for example, comprise, consist essentially of, or consist of silicon dioxide.

The levels 30 and 32 may be of any suitable thicknesses; and may be the same thickness as one another, or different thicknesses relative to one another.

The channel material pillars 22 extend through an insulative mass 36 and contact a conductive structure 38.

A gap is provided between the stack 28 and the insulative mass 36 to indicate that there may be additional materials and/or components provided within the assembly 10 which are not shown. For instance, source-side select gates may be provided within the illustrated gap between the stack 28 and insulative mass 36.

The insulative mass 36 may comprise any suitable composition(s) such as, for example, silicon dioxide.

Figure 4:
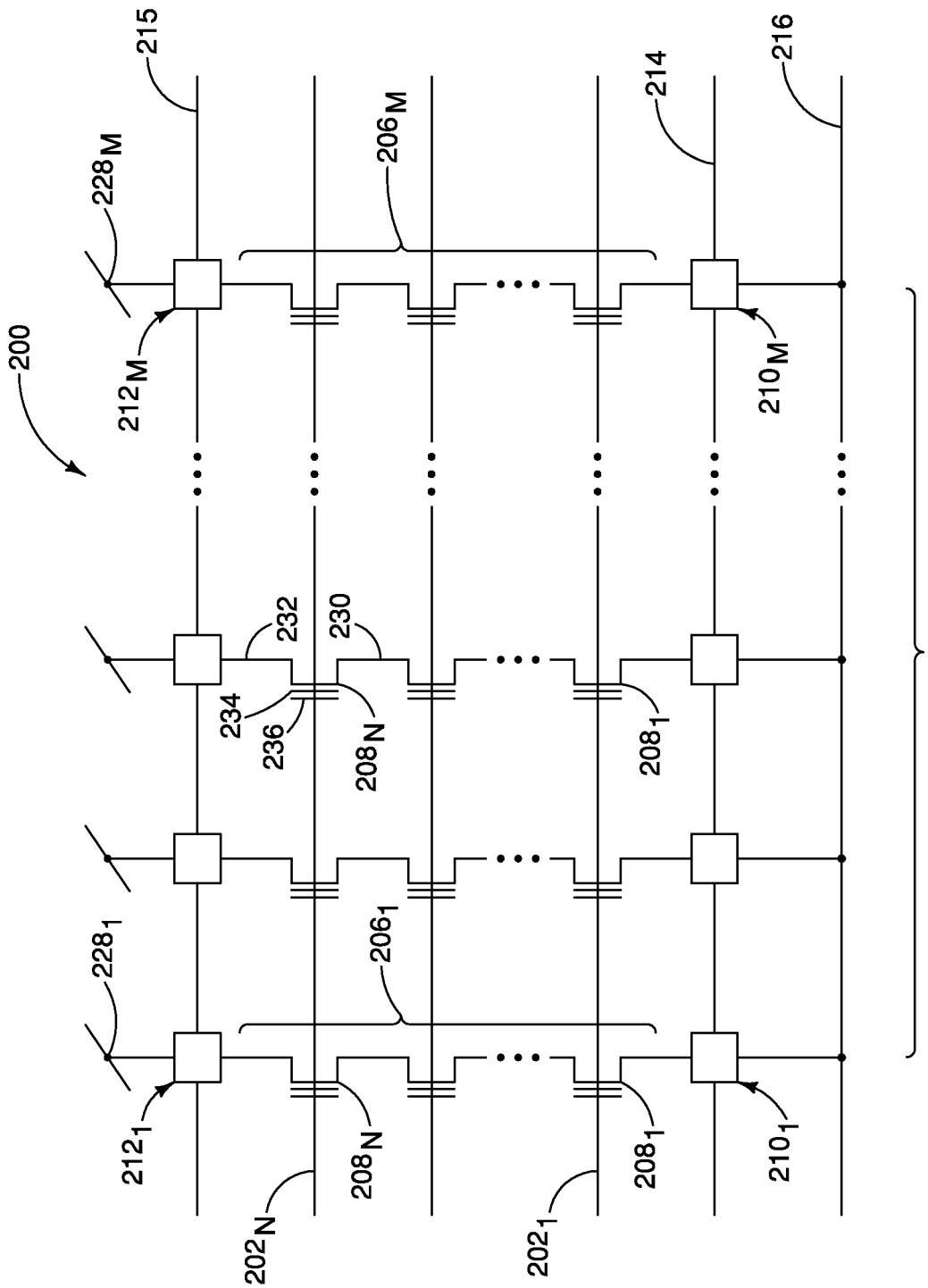
FIG. 4 is a schematic of a prior art NAND memory array.

The conductive structure 38 may correspond to a source line analogous to the source line 216 discussed above with reference to FIG. 4. The conductive structure 38 may comprise any suitable composition(s). In some embodiments, the illustrated region of the conductive structure 38 comprises conductively-doped semiconductor material 40 (for instance, n-type silicon). In some embodiments, the conductively-doped semiconductor material 40 may be over and directly against a metal-containing material (not shown). For instance, the conductive structure 38 may comprise doped semiconductor material 40 over a metal-containing material (such as, for example, a material comprising one or more of titanium nitride, tungsten, tantalum nitride, etc.).

In some embodiments, the conductive structure 38 may be considered to be representative of a horizontally-extending structure, and the semiconductor material 40 may be referred to as a first semiconductor material. The channel material pillars 22 may be considered to be representative of vertically-extending structures over the horizontally-extending structure 38, and may be considered to comprise a second semiconductor material 14. The first and second semiconductor materials 40 and 14 may be the same composition as one another in some embodiments (for instance, both may comprise n-type doped silicon), or may be different compositions than one another (for instance, one may primarily comprise germanium while the other primarily comprises silicon).

Although three vertically-extending structures 22 are illustrated in FIG. 5, it is to be understood that any suitable number of vertically-extending structures may be associated with the horizontally-extending structure 38. Generally, there will be at least one vertically-extending structure 22 associated with the horizontally-extending structure 38.

The terms "vertically-extending" and "horizontally-extending" are utilized relative to one another to indicate that the structure 38 extends primarily along a horizontal direction, while the structures 22 extend primarily along the vertical directions. In some embodiments, the structures 22 may be absolutely vertical, and the structure 38 may be absolutely horizontal, so that the structures 22 extend orthogonally relative to the structure 38. In other embodiments, the structures 22 may extend substantially orthogonally relative to the structure 38, with the term "substantially orthogonal" meaning orthogonal to within reasonable tolerances of fabrication and measurement.

The channel material pillars 22 have bottom regions 42 within the insulative mass 36. Such bottom regions include terminal ends 43 of the pillars 22, and include non-terminal segments 45 above the terminal ends. The terminal ends 43 directly contact the conductive material 40 of the conductive structure 38, and the non-terminal segments 45 are above the terminal ends 43.

The bottom regions 42 have a vertical dimension H. Such vertical dimension may be any suitable vertical dimension; and in some embodiments may be less than or equal to about 150 (nanometers) nm, less than or equal to about 100 nm, or less than or equal to about 50 nm. The channel material pillars 22 may have any suitable total height; and in some embodiments may have a total height of at least about 1 micron (μ), at least about 2μ, etc. Accordingly, the bottom region 42 of the channel material pillars is a small percentage of the overall height of the channel material pillars.

Each of the channel material pillars 22 is adjacent a structure 44, with the structures 44 being outwardly displaced relative to the charge-blocking material 20 in the illustrated embodiment. The bottom regions 42 of the pillars 22 may be defined to be the regions of pillars 22 that are at or below an elevational level of the uppermost surfaces of the structures 44. FIG. 5A is a view along the line A-A of FIG. 5 and shows that each structure 44 is an annular ring surrounding one of the channel material pillars 22.

The structures 44 comprise etch-stop material 46 (with a purpose of the etch-stop material being described in more detail below with reference to FIGS. 13 and 14). In some embodiments, the etch-stop material 46 may comprise one or more of magnesium (Mg), scandium (Sc), yttrium (Y) and lanthanide elements. The term "lanthanide elements" means the 15 rare earth elements having atomic numbers 57 through 71; and specifically includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). In some applications, the material 46 may comprise oxides of one or more of Mg, Sc, Y, La, Ce, Pr, Nd, Pm, Sm, Eu, Gd, Tb, Dy, Ho, Er, Tm, Tb and Lu. For instance, in some embodiments the material 46 may comprise, consist essentially of, or consist of one or more of magnesium oxide, cerium oxide and lanthanum oxide.

The structures 44 are along the bottom regions 42 of the channel material pillars 22. In the embodiment of FIG. 5, the structures 44 are along the terminal ends 43 of the channel material pillars 22, and are also along the non-terminal segments 45. Accordingly, the elements within the composition of structures 44 may be detected along the terminal ends of the channel material pillars 22, as well as along the non-terminal segments 45 with appropriate analytical analysis of the configuration of FIG. 5.

The structures 44 are angled relative to the vertically-extending charge-blocking material 20, and regions of the structures 44 are spaced from the charge-blocking material 20 by an intervening material 48. The intervening material 48 may comprise any suitable composition(s); and in some embodiments may comprise, consist essentially of, or consist of silicon dioxide.

The stack 28 and conductive structure 38 are shown to be supported over a base 50. The base 50 may comprise semiconductor material; and may, for example, comprise, consist essentially of, or consist of monocrystalline silicon. The base 50 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 50 may correspond to a semiconductor substrate containing one or more materials associated with integrated circuit fabrication. Such materials may include, for example, one or more of refractory metal materials, barrier materials, diffusion materials, insulator materials, etc.

A gap is provided between the structure 38 and the base 50 to indicate that other components and materials may be provided between the structure 38 and the base 50.

Figure 6:
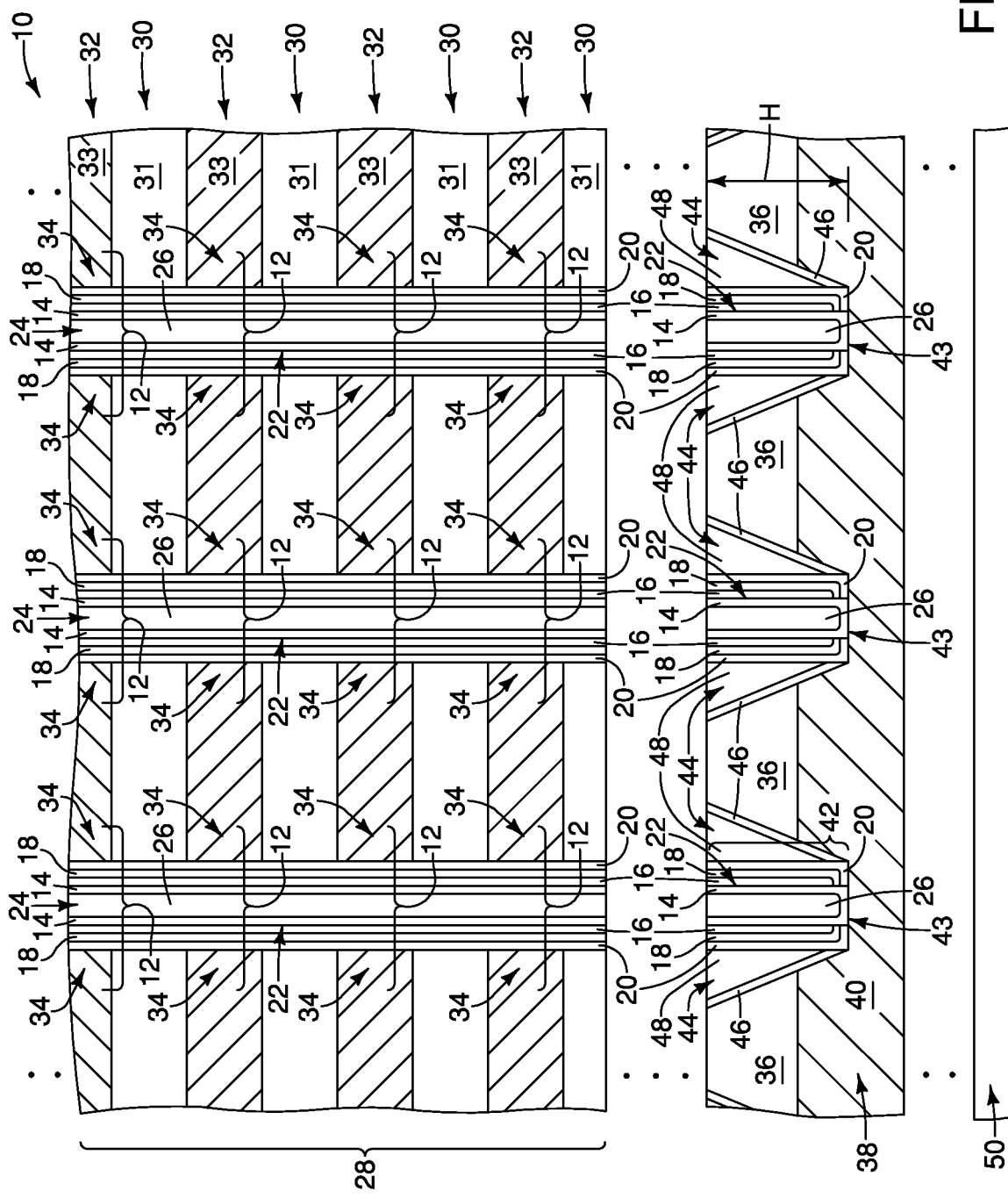

The configuration of FIG. 5 shows the channel material pillars 22 extending to an upper surface of the conductive structure 38. In other embodiments, the channel material pillars 22 may penetrate into the conductive material 40 of the conductive structure 38, as shown in FIG. 6. In such embodiments, the structures 44 may also penetrate into the material 40 of the conductive structure 38 (as shown in FIG. 6). Accordingly, the composition of the structures 44 may penetrate into the conductive material 40 and be detectable as extending into the conductive material 40; with such composition including one or more of Mg, Sc, Y, La, Ce, Pr, Nd, Pm, Sm, Eu, Gd, Tb, Dy, Ho, Er, Tm, Tb and Lu and some embodiments.

In the illustrated embodiment of FIG. 6, the bottom regions 42 of the channel material pillars 22 are shown to include portions of the channel material pillars which extend into the conductive material 40 of the conductive structure 38, as well as portions of the channel material pillars within the insulative mass 36.

Figure 7:
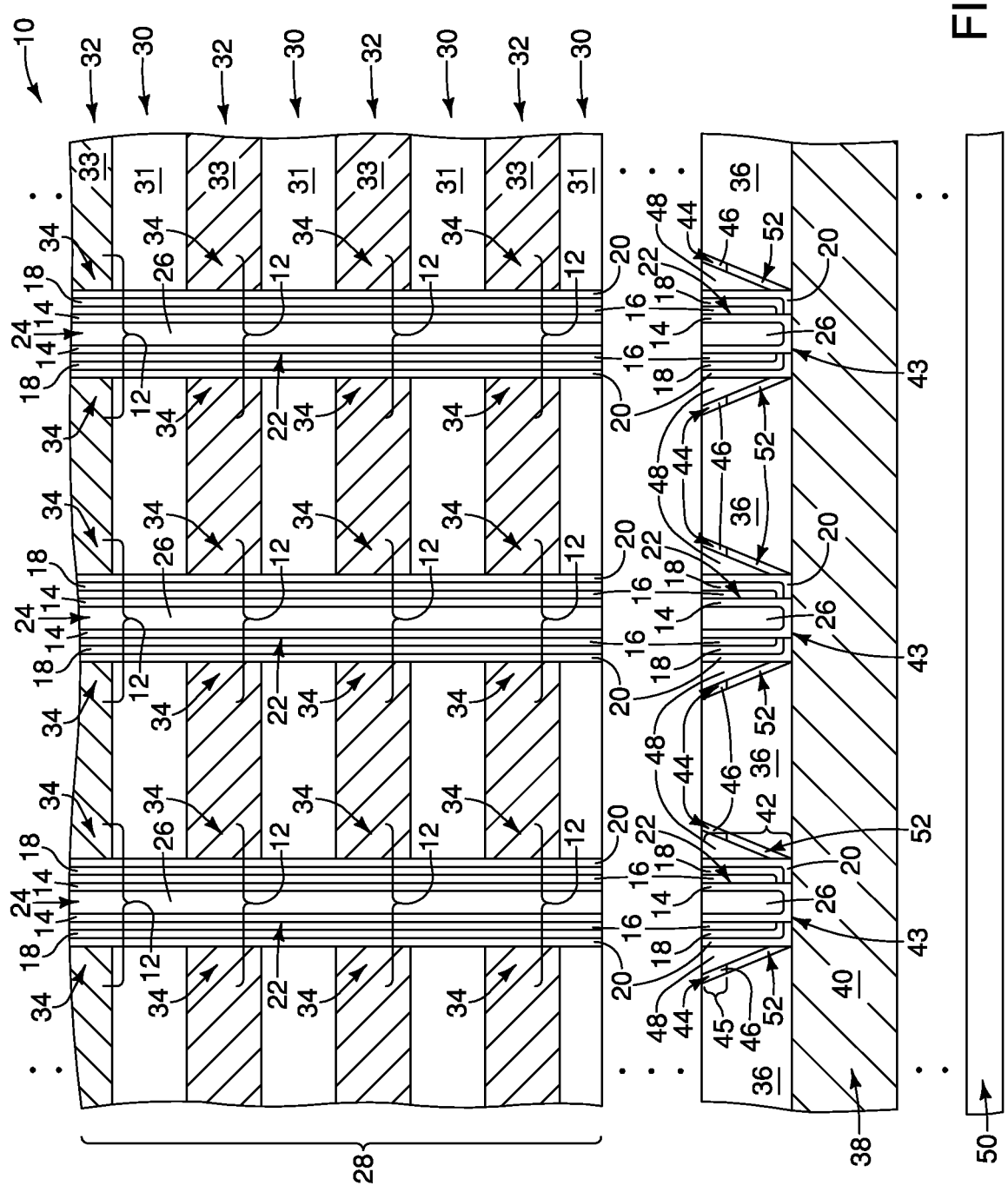
Figure 8:
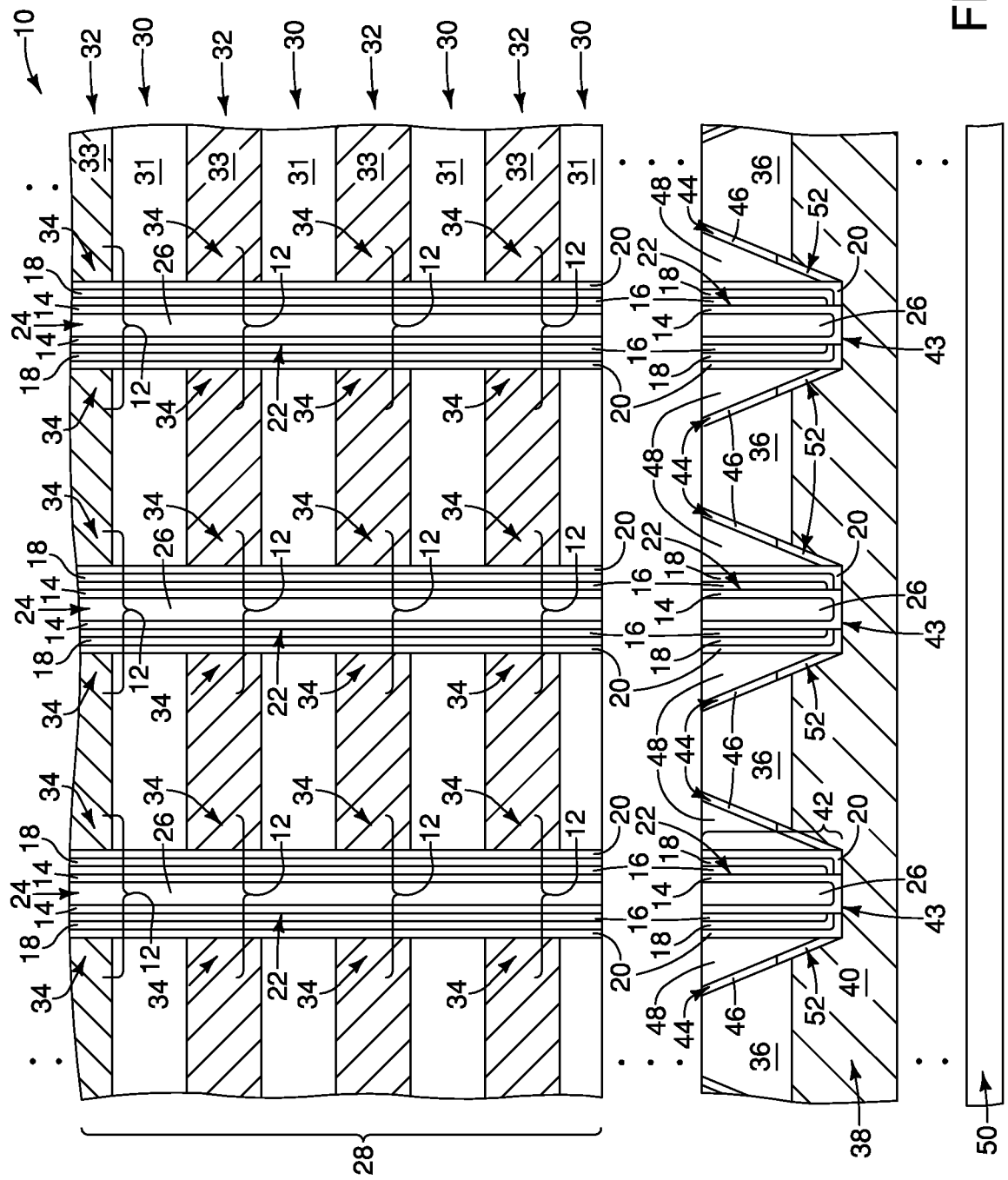

In some embodiments, some of the material 46 of structures 44 may be removed with a wet etch (described below with reference to FIG. 17) so that the remaining material 46 is over a void region. Examples of such embodiments are shown in FIGS. 7 and 8. FIG. 7 shows a configuration analogous to that of FIG. 5, but the material 46 of structures 44 is over void regions 52. Accordingly, the material 46 is along non-terminal segments 45 of the channel material pillars 22, but is not along the terminal ends 43 of the channel material pillars. FIG. 8 shows a configuration analogous to that of FIG. 6, but differs from FIG. 6 in that the material 46 of structures 44 is over void regions 52.

The assemblies discussed above with reference to FIGS. 5-8 may be formed with any suitable processing. Example processing is described with reference to FIGS. 9-22.

Figure 1:
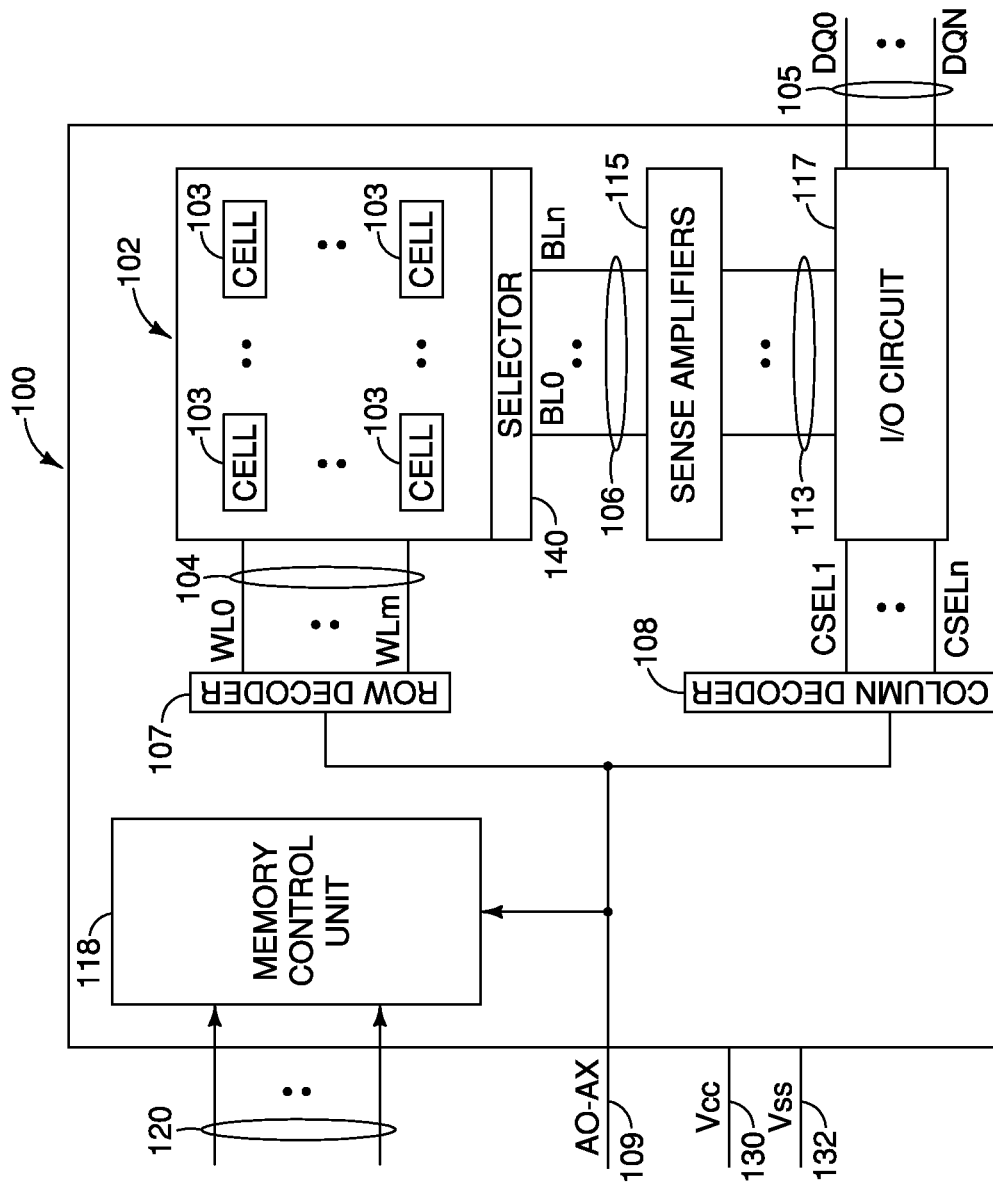
FIG. 1 shows a block diagram of a prior art memory device having a memory array with memory cells.
Figure 2:
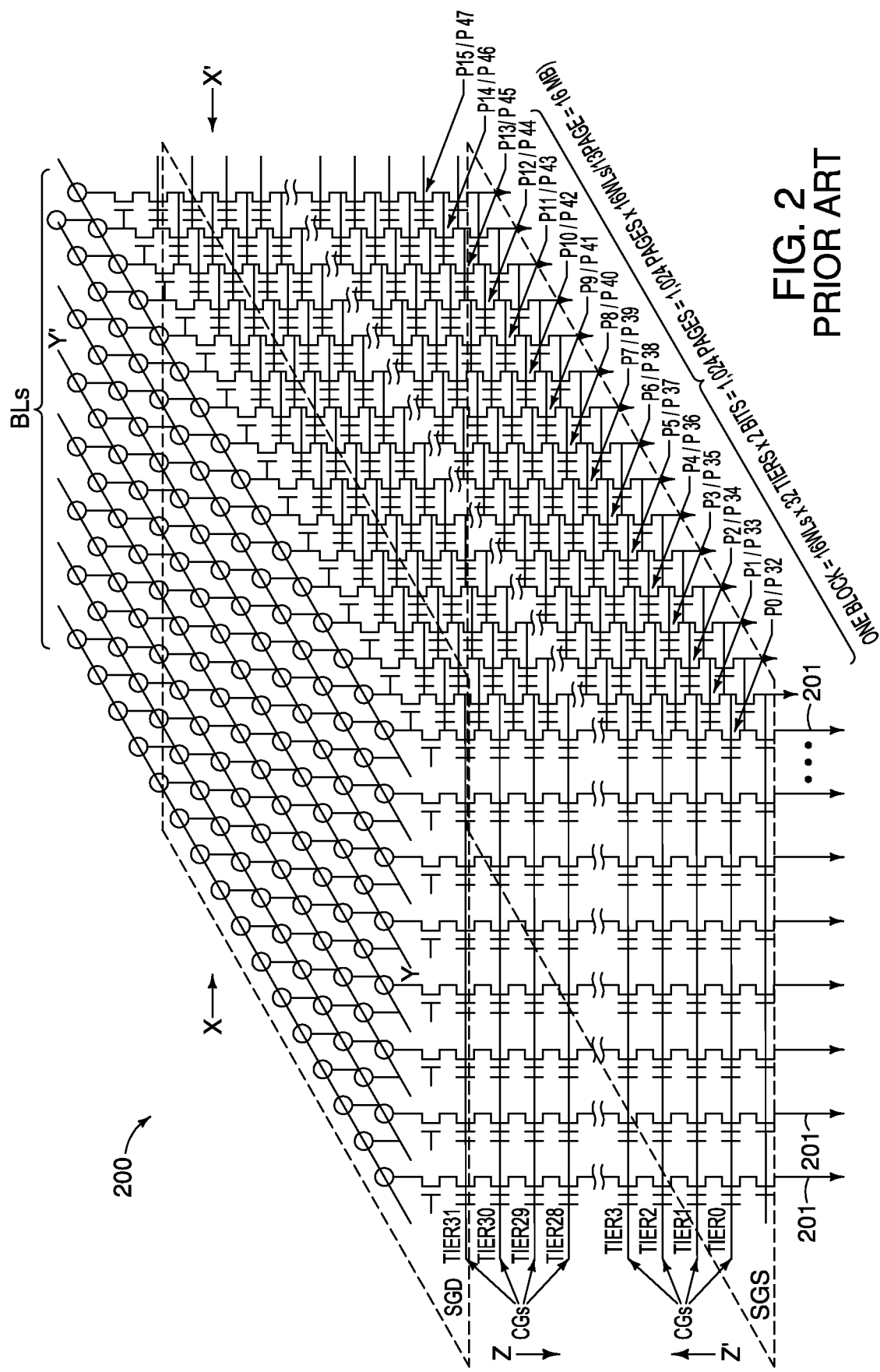
FIG. 2 shows a schematic diagram of the prior art memory array of FIG. 1 in the form of a 3D NAND memory device.
Figure 3:
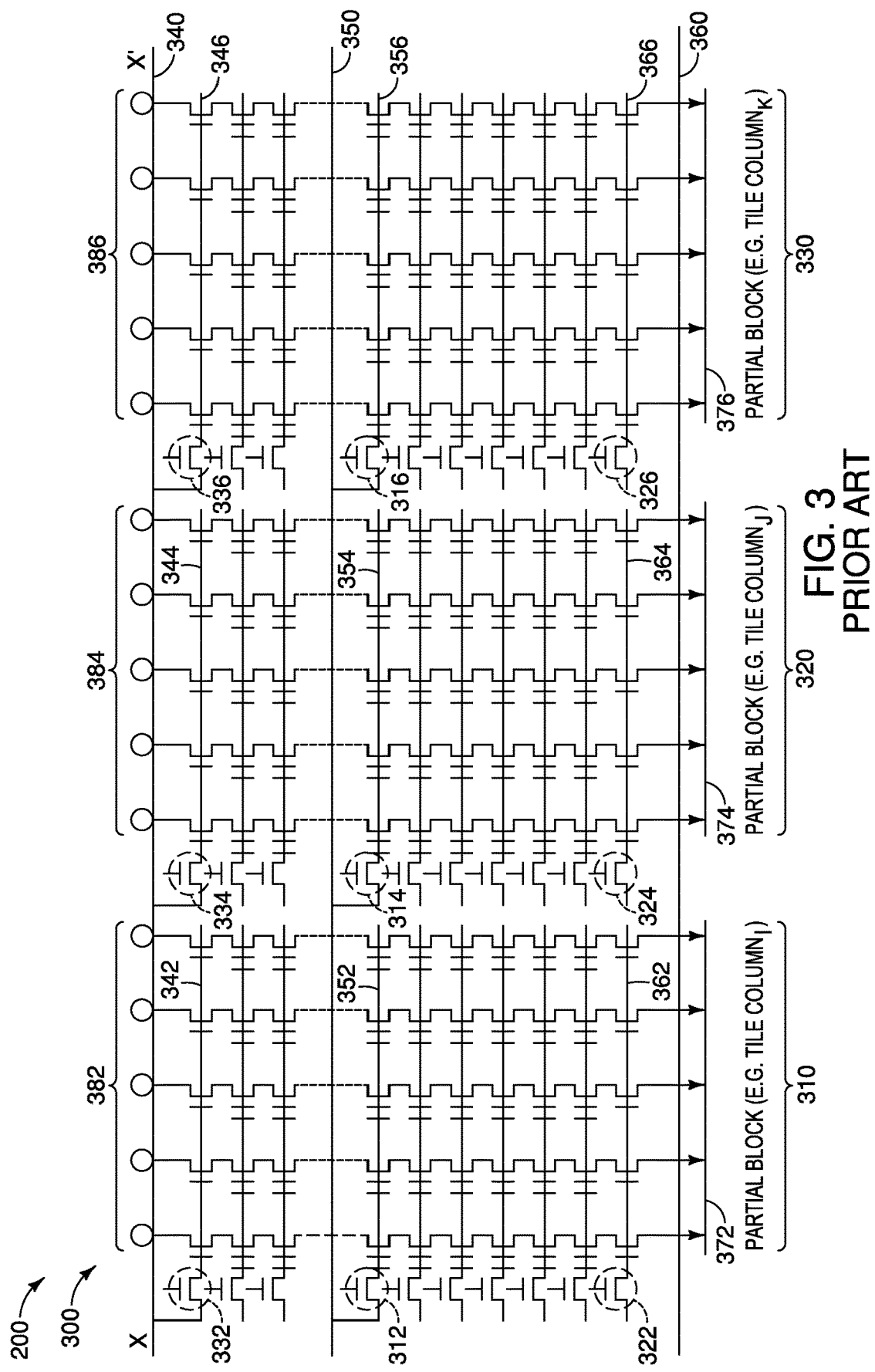
FIG. 3 shows a cross sectional view of the prior art 3D NAND memory device of FIG. 2 in an X-X' direction.

Referring to FIG. 9, construction 10 is shown at a process stage after the horizontally-extending structure 38 has been formed across the base 50 (the base 50 is shown in FIG. 1, but is not shown in FIG. 9 in order to simplify FIG. 9 and the drawings which follow). The structure 38 includes the material 40. The material 40 comprises conductively-doped semiconductor material; such as, for example, n-type polysilicon. In some embodiments, the material 40 may be referred to as a first semiconductor material.

The structure 38 comprises an upper surface 39 along the material 40, and the mass 36 is formed across such upper surface. In the illustrated embodiment, the mass 36 is directly against the upper surface 39 of the material 40.

The mass 36 may comprise any suitable material. For instance, the mass 36 may comprise, consist essentially of, or consist of silicon dioxide. In some embodiments, the mass 36 may be referred to as an insulative mass.

Referring to FIG. 10, openings 54 are formed through the mass 36 to the upper surface 39 of the material 40. Although the openings 54 are shown extending only to the upper surface of the material 40, in other embodiments the openings 54 may penetrate into the material 40.

Referring to FIG. 11, the openings 54 are lined with the material 46 to narrow the openings, and the narrowed openings are then filled with material 48. Subsequently, planarization (e.g., chemical-mechanical polishing) may be conducted to form the illustrated planarized surface 55 extending across the mass 36 and the materials 46 and 48. The materials 46 and 48 may be referred to as first and second materials, respectively; and may comprise the compositions described above relative to FIG. 5. In some example embodiments, the second material 48 may comprise, consist essentially of, or consist of silicon dioxide. In some example embodiments, the first material 46 may comprise one or more of magnesium, scandium, yttrium and lanthanide elements incorporated into one or more oxides.

The first and second materials 46 and 48 together form plugs 56 within the openings 54.

Referring to FIG. 12, a stack 58 is formed over the mass 36 and plugs 56. The stack 58 comprises first levels 60 and second levels 62 which alternate with one another. The levels 60 comprise material 61, and the levels 62 comprise material 63. In some embodiments, the materials 61 and 63 may be the same as the materials 31 and 33, respectively, of FIG. 5. Thus, the stack 58 of FIG. 12 may be the same as the stack 28 of FIG. 5. Alternatively, the levels 60 may comprise insulative material (for instance, the same material as levels 30 of FIG. 5; and in some embodiments may comprise silicon dioxide), and the levels 62 may comprise sacrificial material (e.g., silicon nitride) suitable for utilization in gate replacement methodologies.

Figure 13:
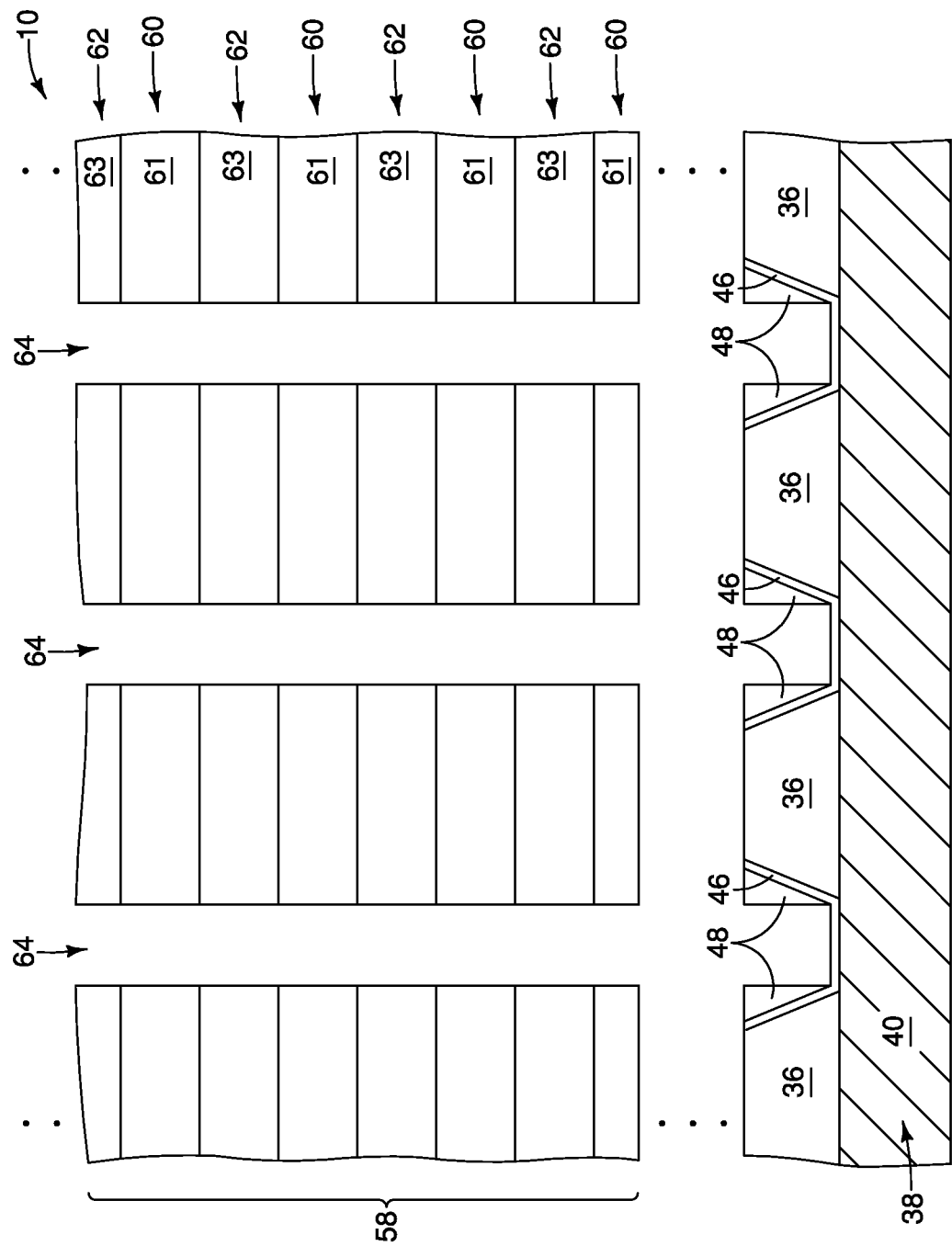

Referring to FIG. 13, openings 64 are formed to extend through the stack 58, and through the second material 48 of the plugs 56 (with the plugs 56 being shown in FIG. 12). The openings 64 terminate on the first material 46. In some embodiments, the material 46 may be referred to as an etch-stop material in that such material stops the downward progression of the etch utilized to form openings 64.

Figure 14:
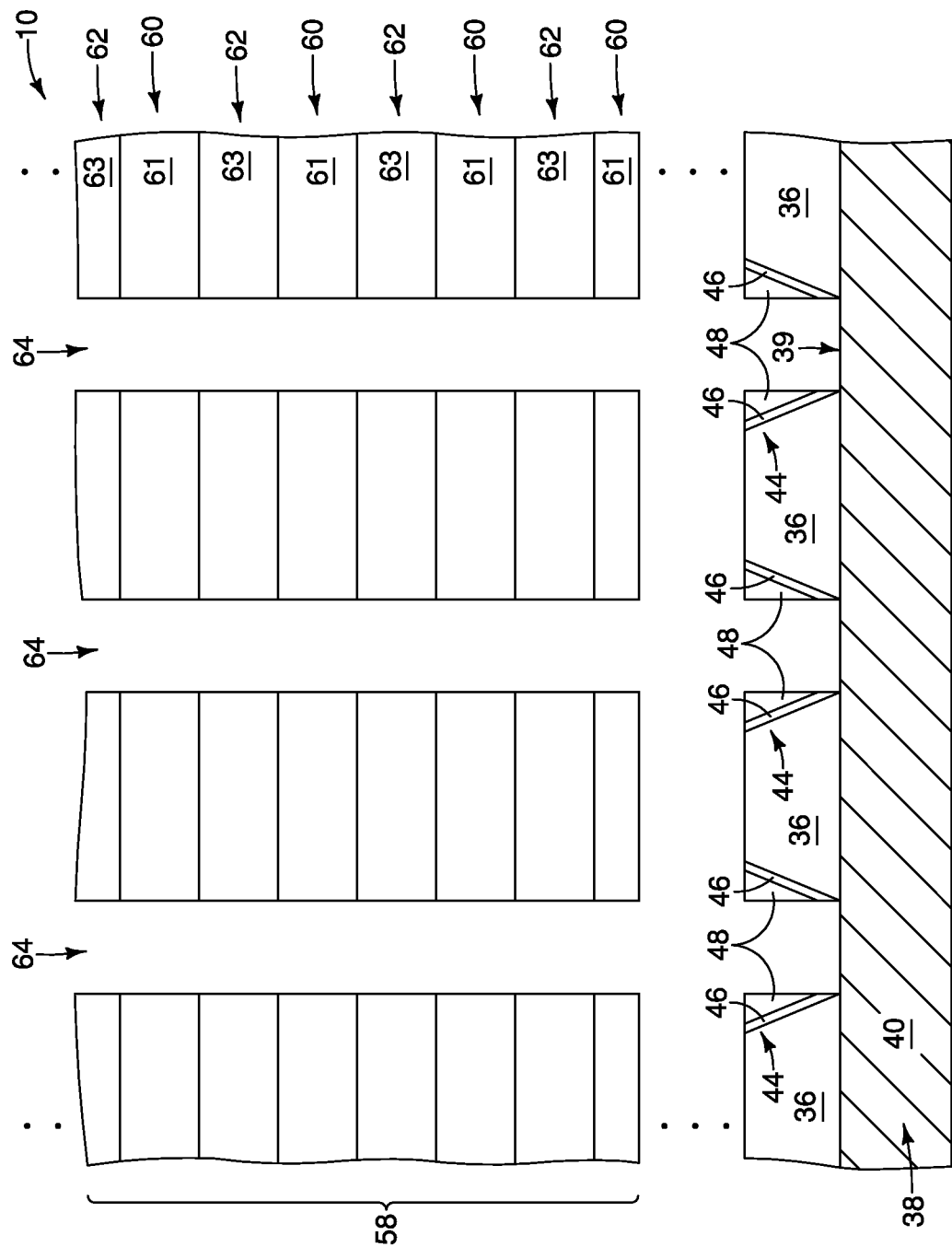

Referring to FIG. 14, the openings 64 are extended through the material 46. Such exposes regions of the upper surface 39 of the semiconductor material 40. Although the openings 64 are shown stopping at the upper surface 39 of semiconductor material 40, in other embodiments the openings may extend into the semiconductor material 40.

An advantage of utilizing the etch-stop material 46 is that such may enable all of the openings 64 to be uniformly formed to substantially identical depths (with the term "substantially identical" meaning identical to within reasonable tolerances of fabrication and measurement). As integration density increases, it is desired to form openings 64 to increasingly higher critical dimensions. It can be difficult to fabricate all of the openings to be of substantially uniform depths as one another unless the openings are formed with the multi-step processing of FIGS. 13 and 14. Specifically, the openings 64 are first formed with a process having a stop point defined by the etch-stop material 46. Accordingly, to the extent that there is variation in the etch rate across the openings 64, the variation will not matter in the end because all of the openings terminate at a common depth defined by the etch-stop material 46. The openings are then extended with a second process which penetrates through the etch-stop material 46. The second process may be a timed process, and will be a relatively short etch since the openings are only extended by a minor amount. Accordingly, there will be little (if any) variation of the depths to which the openings 64 penetrate during the second process since the second process is too short of an etch to enable large amounts of variation to manifest across the openings.

It is noted that some conventional processes fabricate openings analogous to the openings 64 by utilizing the mass 36 as an etch-stop material. In other words, the conventional methods lack the plugs 56 of FIG. 11, and instead utilize the entire mass 36 as an etch-stop material. A problem with such conventional methods is that they may not be cost-effective when utilizing the specialized etch-stop materials described herein. Instead, the conventional methods typically utilize aluminum oxide as the etch-stop material. In contrast, methodologies described herein may cost-effectively utilize oxides of one or more of magnesium, scandium, yttrium and lanthanide elements. Such may provide at least a 10-fold enhancement of etch selectivity as compared to aluminum oxide for the etches utilized to form openings 64 (e.g., for etches penetrating through silicon dioxide of levels 60 and silicon nitride of levels 62).

Figure 15:
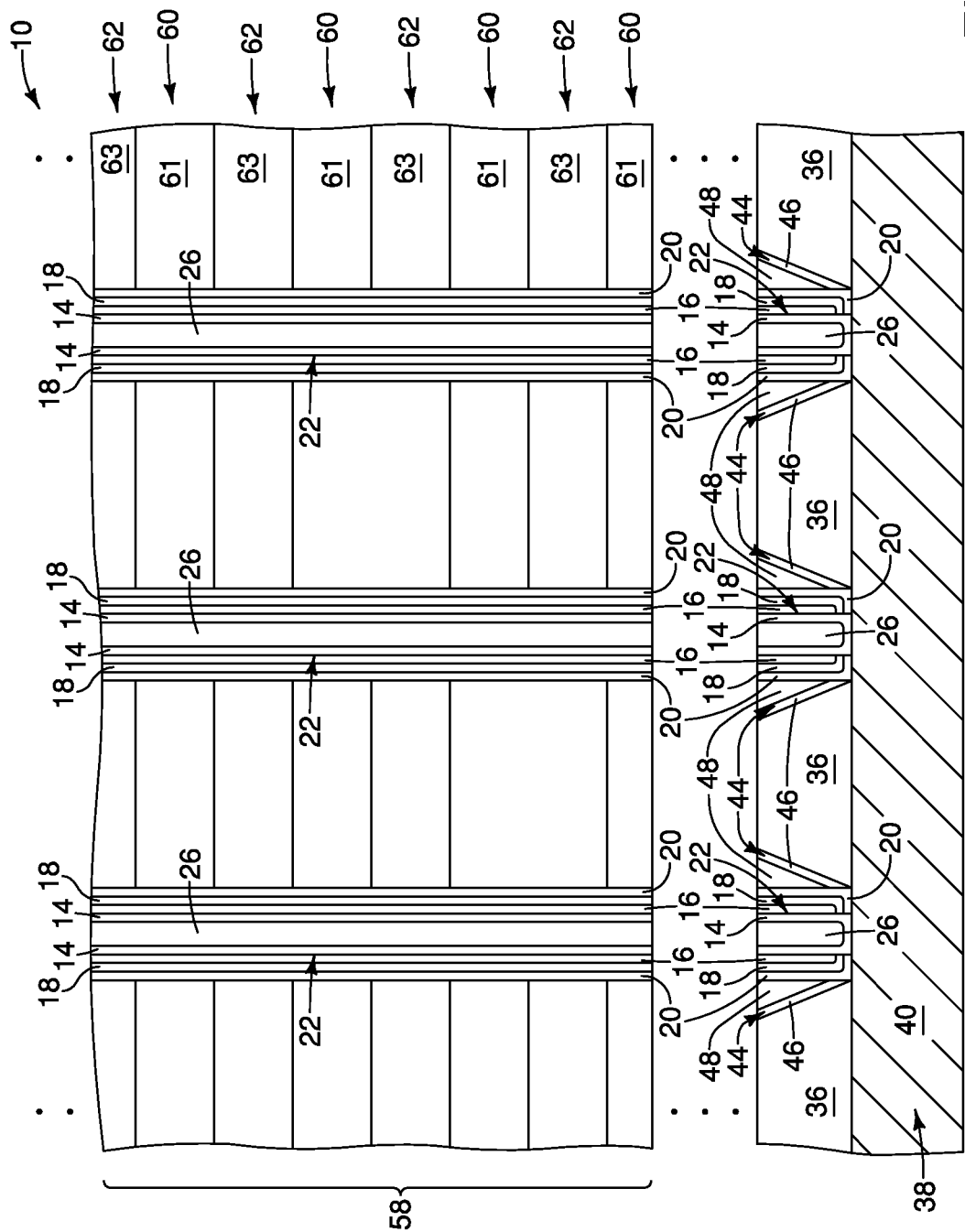

Referring to FIG. 15, the vertically-extending channel material pillars 22 are formed within the openings 64, together with the tunneling material 16, charge-storage material 18, and charge-blocking material 20. The channel material pillars 22 comprise the channel material 14; which in some embodiments may be referred to as a second semiconductor material. The second semiconductor material 14 may be compositionally the same as the first semiconductor material 40, or may be compositionally different from the first semiconductor material 40. For instance, in some embodiments the second semiconductor material 14 and the first semiconductor material 40 may both comprise silicon. In other embodiments, one of the first and second semiconductor materials 14 and 40 may comprise, consist essentially of, or consist of silicon; while the other comprises a different semiconductor material.

Figure 16:
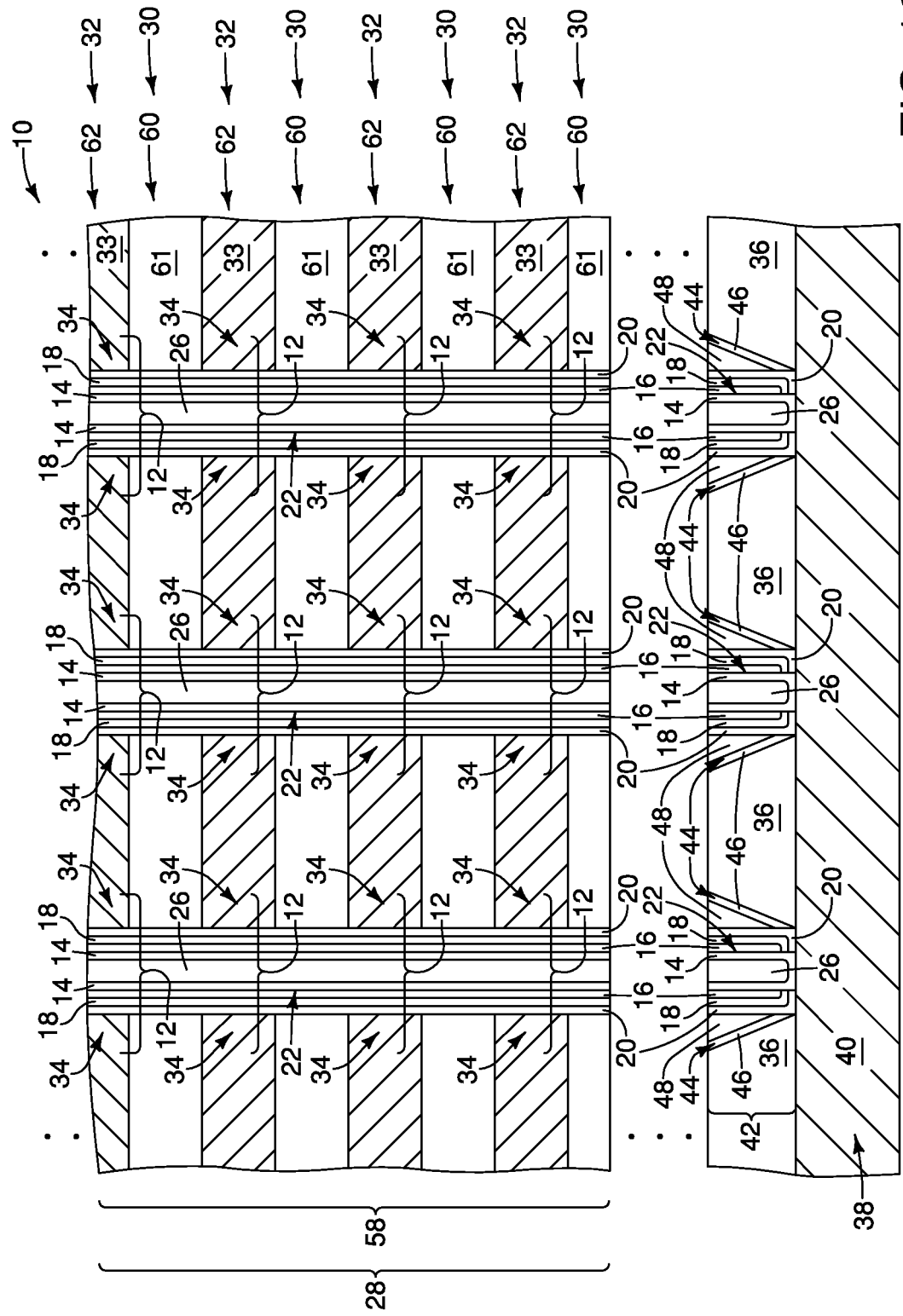

Referring to FIG. 16, the sacrificial material 63 of FIG. 15 is replaced with conductive material 33. Accordingly, the stack 58 becomes a stack 28 of the type described above with reference to FIG. 5. The material 61 of levels 60 of FIG. 16 may be the same material 31 as utilized for the insulative levels 30 of FIG. 5.

In some embodiments the material 63 (FIG. 15) of stack 58 may comprise conductive material analogous to the conductive material 33. In such embodiments, the gate replacement described relative to FIG. 16 may be omitted.

Figure 17:
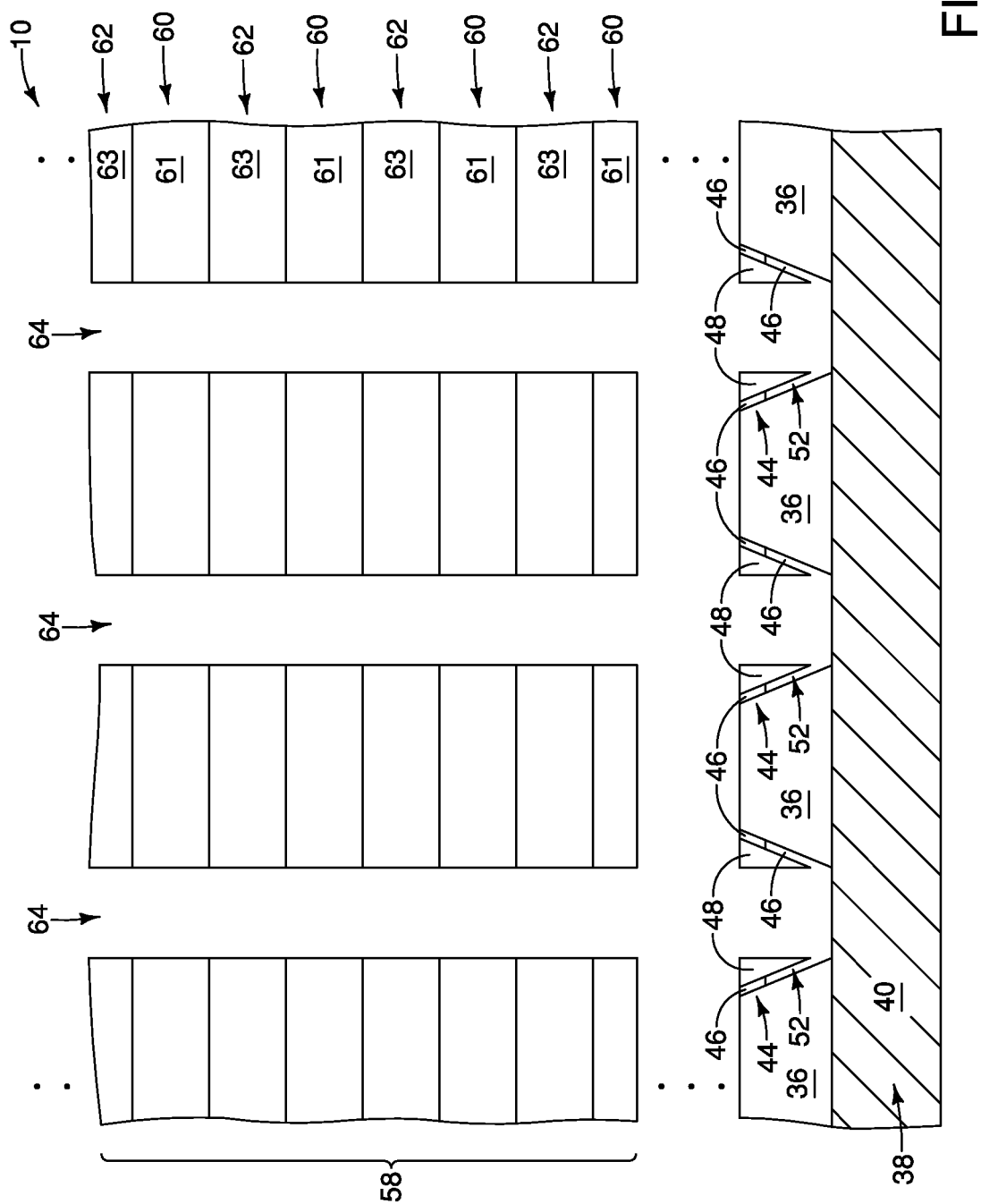
FIGS. 17 and 18 are diagrammatic cross-sectional views of regions of an example construction at example process stages of an example method for fabricating an example memory array. The process stage of FIG. 17 may follow that of FIG. 13.
Figure 18:
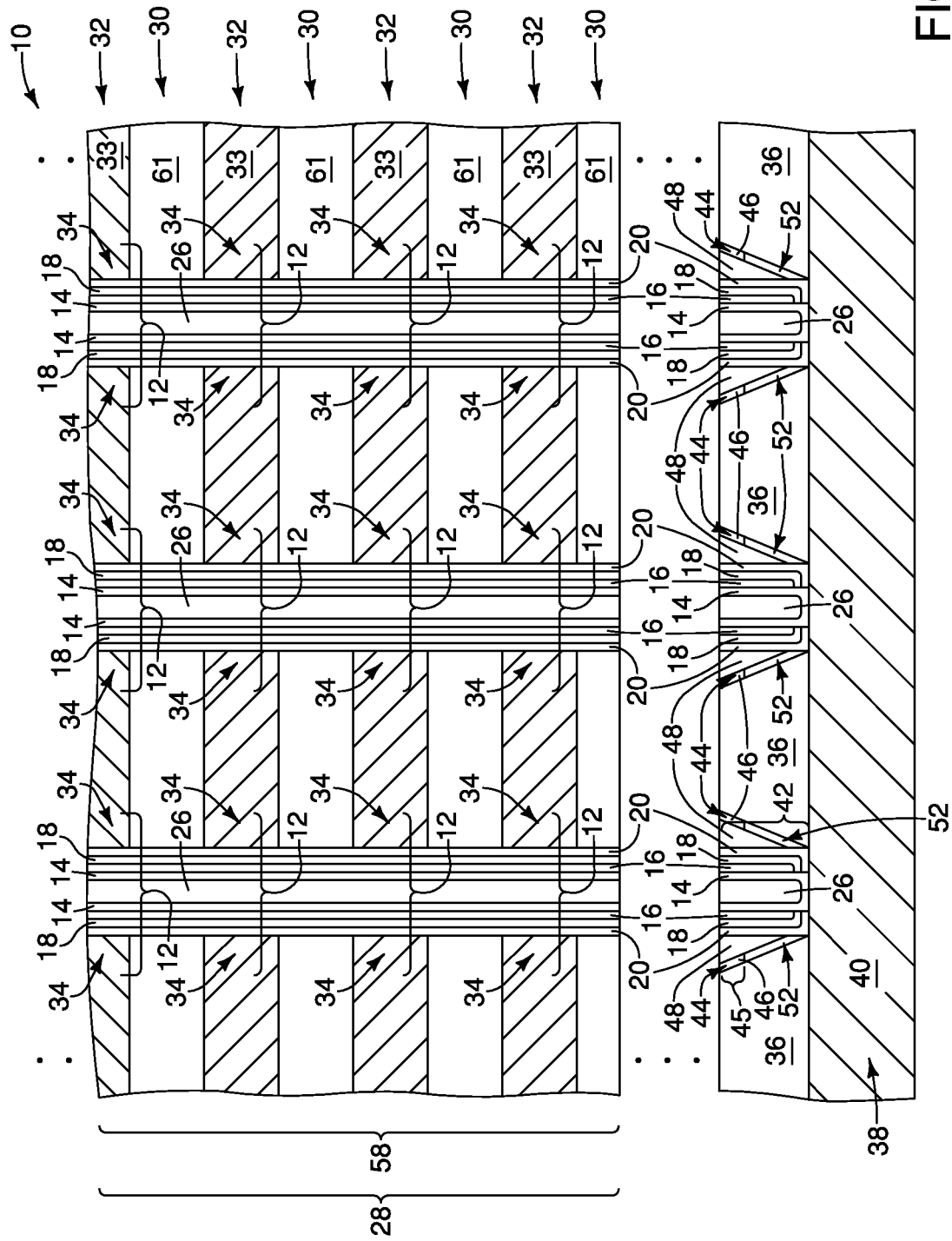

The assembly of FIG. 16 comprises the structures 44 along the bottom regions 42 of the channel material pillars 22. The structures 44 comprise the etch-stop material 46, and are in a configuration analogous to that described above with reference to FIG. 5. In other embodiments, void regions may be formed beneath the etch-stop material 46 analogous to the embodiment of FIG. 7 (with the void regions of FIG. 7 being shown as void regions 52). FIGS. 17 and 18 describe example processing which may be utilized to form such void regions.

Referring to FIG. 17, construction 10 is shown at a process stage which may follow that of FIG. 13; and which may be alternative to that of FIG. 14. The process stage of FIG. 14 utilized a substantially anisotropic etch to penetrate through the etch-stop material 46. In contrast, the process stage of FIG. 17 shows a configuration resulting after an isotropic etch is utilized to penetrate through the etch-stop material 46. The isotropic etch forms void regions 52, and in the shown embodiment leaves remaining portions of the etch-stop material 46 over the void regions. In other embodiments, the isotropic etching may remove an entirety of the etch-stop material 46.

FIG. 18 shows a process stage subsequent to that of FIG. 17, and analogous to that of FIG. 16. The construction 10 of FIG. 18 may be identical to that described above with reference to FIG. 7.

Figure 19:
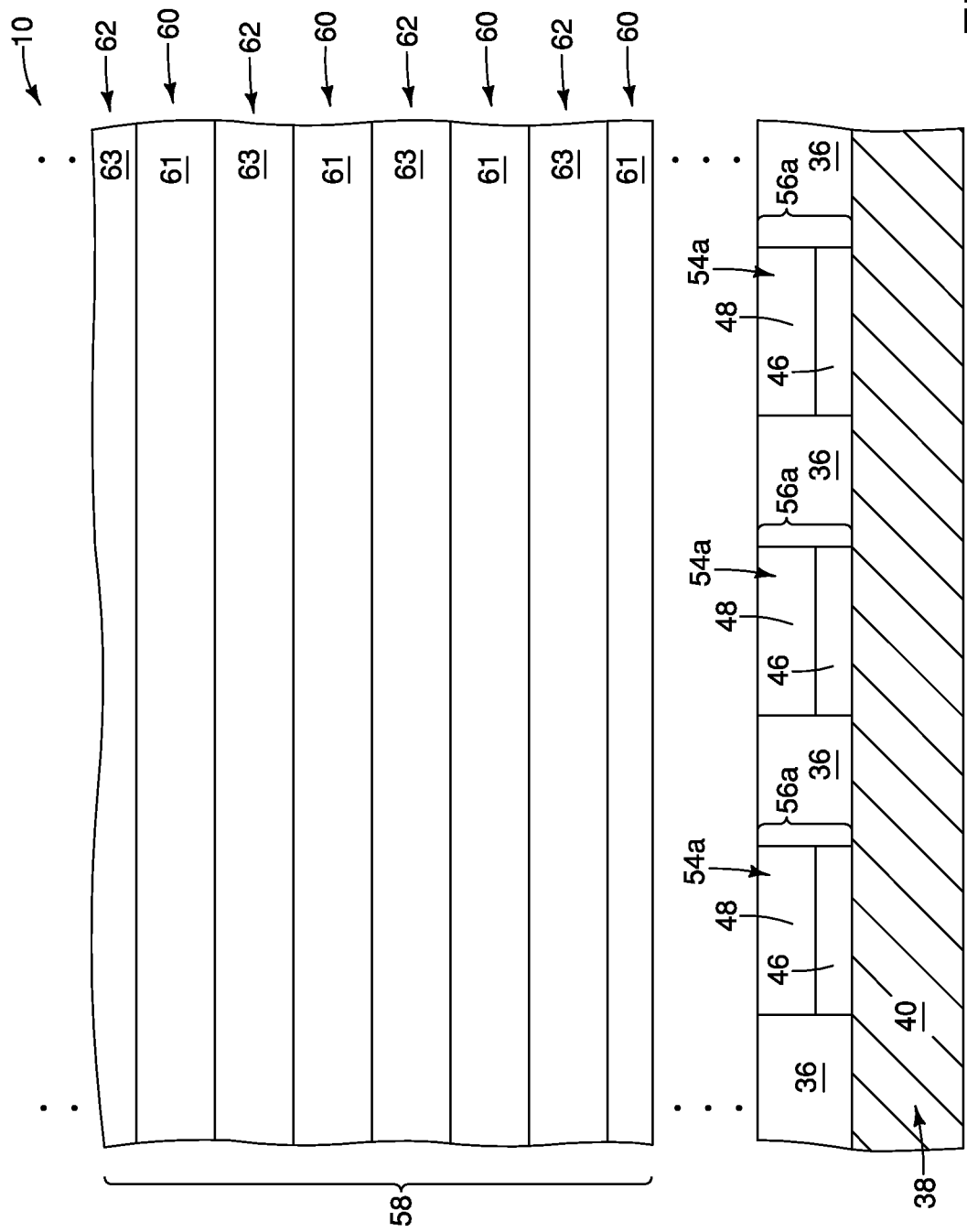
FIGS. 19-22 are diagrammatic cross-sectional views of regions of an example construction at example process stages of an example method for fabricating an example memory array. The process stage of FIG. 19 may follow that of FIG. 9.

The embodiment of FIG. 11 shows the etch-stop material 46 configured as a liner extending conformally along inner surfaces of the openings 54. In other embodiments, the etch-stop material may be deposited as a layer along lower regions of the openings. For instance, FIG. 19 shows construction 10 at a process stage which may follow that of FIG. 9. Openings 54a have been formed through mass 36 and filled with materials 46 and 48.

The openings 54a of FIG. 19 have a different shape than the openings 54 of FIG. 10 (and specifically have straight sidewalls rather than the tapered sidewalls of the openings 54). In other embodiments, openings having tapered sidewalls may be utilized instead of the openings 54a having the straight sidewalls at the processing stage of FIG. 19. Also, it is noted that in some embodiments the openings 54 of FIG. 10 may be replaced with openings having straight sidewalls analogous to the openings 54a of FIG. 19.

The materials 46 and 48 together form plugs 56a analogous to the plugs 56 of FIG. 12.

The construction of FIG. 19 is at a processing stage analogous to that of FIG. 12, and comprises the stack 58.

Figure 20:
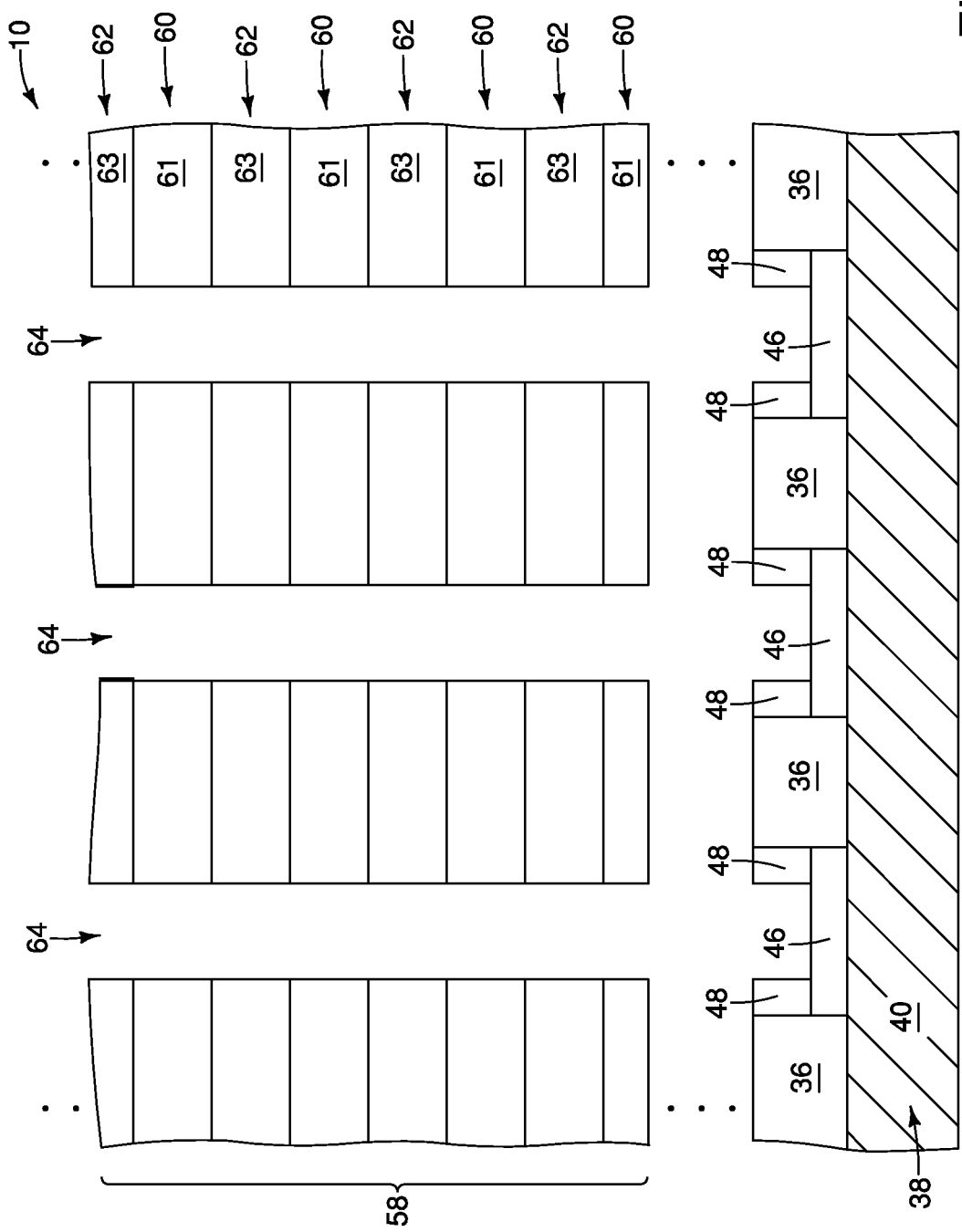

Referring to FIG. 20, openings 64 are formed to extend through the stack 58, and through the material 48 of the plugs 56a (with the plugs 56a being shown in FIG. 19). The openings 64 terminate on the etch-stop material 46.

Figure 21:
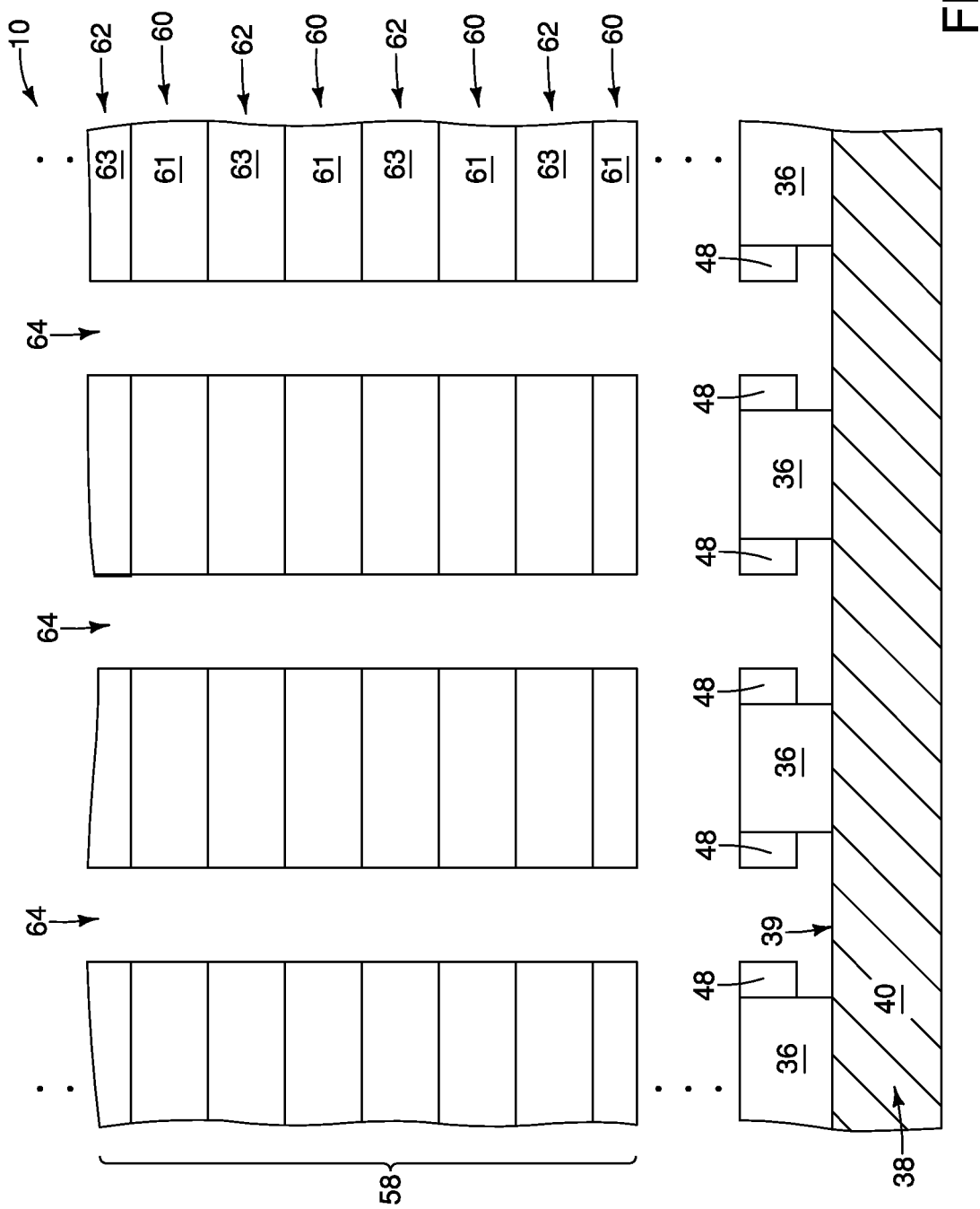

Referring to FIG. 21, the openings 64 are extended through etch-stop material 46 (FIG. 20) with an isotropic etch which removes all of the material 46. In the illustrated embodiment, the openings 64 stop on the upper surface 39 of the conductive structure 38. In other embodiments, the openings may penetrate into the conductive material 40 of the conductive structure 38.

Figure 22:
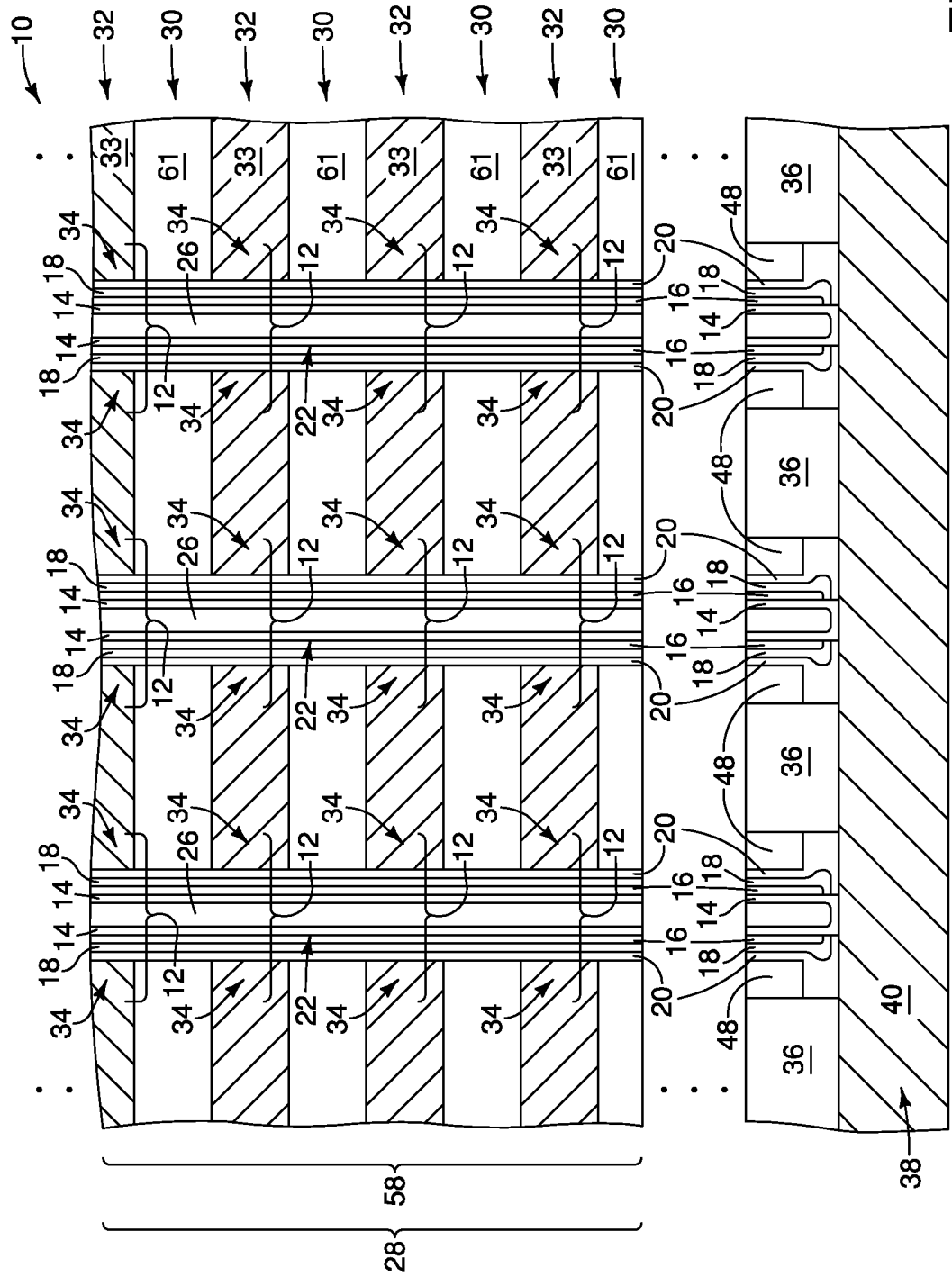

Referring to FIG. 22, the channel material pillars 22 are formed within openings 64 (FIG. 21), together with the tunneling material 16, charge-storage material 18 and charge-blocking material 20. Also, sacrificial material 63 (FIG. 21) is replaced with conductive material 33 to form a stack 28 of alternating insulative levels and conductive levels.

The illustrated embodiment shows the charge-blocking material 20 extending to under the material 48 of plugs 56a (with the plugs being described above with reference to FIG. 19). In other embodiments, the material 20 may extend only partially under the material 48 to leave voids under the material 48.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly which has channel material pillars, and memory cells along the channel material pillars. A conductive structure is under the channel material pillars. The conductive structure has doped semiconductor material in direct contact with bottom regions of the channel material pillars. One or more of magnesium, scandium, yttrium and lanthanide elements is along the bottom regions of the channel material pillars.

Some embodiments include an assembly having a horizontally-extending structure comprising a first semiconductor material, and having one or more vertically-extending structures over the horizontally-extending structure and comprising a second semiconductor material. The second semiconductor material of said one or more vertically-extending structures directly contacts the first semiconductor material of the horizontally-extending structure along terminal ends of the one or more vertically-extending structures. The terminal ends of the one or more vertically-extending structures are comprised by bottom regions of the one or more vertically-extending structures. One or more of magnesium, scandium, yttrium and lanthanide elements is along the bottom regions of the one or more vertically-extending structures.

Some embodiments include a method of forming an assembly. A horizontally-extending structure is formed, with the horizontally-extending structure comprising first semiconductor material. A mass is formed across an upper surface of the first semiconductor material and is directly against the upper surface of the first semiconductor material.

Openings are formed to extend through the mass. Plugs are formed within the openings. The plugs comprise a second material over a first material. The first material includes one or more of magnesium, scandium, yttrium and lanthanide elements. The second material is compositionally different from the first material. A stack of alternating first and second levels is formed over the mass and the plugs. Openings are formed through the stack and the second material of the plugs. The openings terminate on the first material of the plugs. The openings are extended through the first material of the plugs. After the openings are extended through the first material, vertically-extending channel material pillars are formed within the openings. The vertically-extending channel material pillars comprise second semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly, comprising:
   channel material pillars which extend vertically;
   memory cells along the channel material pillars;
   a conductive structure under the channel material pillars and comprising doped semiconductor material in direct contact with bottom regions of the channel material pillars; and
   a material consisting of scandium oxide along the bottom regions of the channel material pillars, wherein the scandium oxide is within annular structures which extend around the bottom regions of the channel material pillars.

2. The assembly of claim 1 wherein the bottom regions of the channel material pillars include terminal ends of the channel material pillars, and include non-terminal segments above the terminal ends; and wherein the annular structures are along the non-terminal segments and not along the terminal ends.

3. The assembly of claim 2 wherein void regions are under the annular structures.

4. The assembly of claim 1 wherein the bottom regions of the channel material pillars include terminal ends of the channel material pillars; and wherein the annular structures are along the terminal ends.

5. An assembly comprising:
   a horizontally-extending structure comprising a first semiconductor material;
   one or more vertically-extending structures over the horizontally-extending structure and comprising a second semiconductor material; the second semiconductor material of said one or more vertically-extending structures directly contacting the first semiconductor material of the horizontally-extending structure along terminal ends of the one or more vertically-extending structures; said terminal ends of the one or more vertically-extending structures being comprised by bottom regions of the one or more vertically-extending structures; and
   a material consisting of scandium oxide along the bottom regions of the one or more vertically-extending structures, the material consisting of scandium oxide being spaced from the bottom regions by one or more intervening material.

6. The assembly of claim 5 wherein the first and second semiconductor materials comprise a same composition as one another.

7. The assembly of claim 5 wherein the first and second semiconductor materials comprise different compositions relative to one another.

8. The assembly of claim 5 wherein both the first semiconductor material and the second semiconductor material comprise silicon.

* * * * *